United States Patent [19]
Blum et al.

[11] 4,414,059
[45] Nov. 8, 1983

[54] FAR UV PATTERNING OF RESIST MATERIALS

[75] Inventors: Samuel E. Blum, White Plains; Karen H. Brown, Yorktown Heights; Rangaswamy Srinivasan, Ossining, all of N.Y.

[73] Assignee: International Business Machines Corporation, Armonk, N.Y.

[21] Appl. No.: 448,126

[22] Filed: Dec. 9, 1982

[51] Int. Cl.³ .................. B44C 1/22; C03C 15/00; C03C 25/06; B05D 3/06
[52] U.S. Cl. .................. 156/659.1; 156/643; 156/668; 156/904; 219/121 LM; 250/492.1; 427/43.1; 427/53.1; 427/54.1; 427/272; 430/313; 430/945
[58] Field of Search .......... 427/43.1, 53.1, 54.1, 427/264, 272; 148/187; 250/492 R; 219/121 LM; 430/296, 313, 315, 317, 318, 945; 156/643, 654, 655, 656, 657, 659.1, 904, 668

[56] References Cited

U.S. PATENT DOCUMENTS

| 3,650,796 | 3/1972 | Jackson et al. ......... | 430/945 X |
|---|---|---|---|
| 3,696,742 | 10/1972 | Parts et al. ......... | 430/945 X |
| 4,054,094 | 10/1977 | Caddell et al. ......... | 430/945 X |
| 4,086,091 | 4/1978 | J. A. Cella ......... | 96/3602 |
| 4,247,496 | 1/1981 | Ken-Ichi Kawakani et al. | 264/22 |
| 4,276,369 | 6/1981 | M. Tsuda et al. ......... | 430/326 |
| 4,379,299 | 4/1983 | Fitzpatrick et al. ......... | 346/1.1 |

FOREIGN PATENT DOCUMENTS 5,140,836  4/1979  Japan

OTHER PUBLICATIONS

IBM Technical Disclosure Bulletin, vol. 21, No. 4, Sep. 1978, p. 1475, Method for Patterning Resists, R. K. Agnihotri et al.
Y. Kauamura et al, "Effective Deep UV Photoetching . . .", Appl. Phys. lett. *40*(5), 1 Mar. 1982, Pgs. 374–375.
T. R. Loree et al, "Spectral Tuning of ArF and KrF . . .", Appl. Phys. lett. *32*(3) 1 Feb. 1978, Pgs. 171–173.

*Primary Examiner*—William A. Powell
*Attorney, Agent, or Firm*—Jackson E. Stanland

[57] ABSTRACT

A technique is described for the fabrication of devices and circuits using multiple layers of materials, where patterned layers of resists are required to make the device or circuit. The fabrication process is characterized by the selective removal of portions of the resist layer by ablative photodecomposition. This decomposition is caused by the incidence of ultraviolet radiation of wavelengths less than 220 nm, and power densities sufficient to cause fragmentation of resist polymer chains and the immediate escape of the fragmented portions from the resist layer. Energy fluences in excess of 10 mJ/cm²/pulse are typically required. The deliverance of a large amount of energy in this wavelength range to the resist layer in a sufficiently short amount of time causes ablation of the polymer chain fragments. No subsequent development step is required for patterning the resist layer.

17 Claims, 8 Drawing Figures

ABLATION

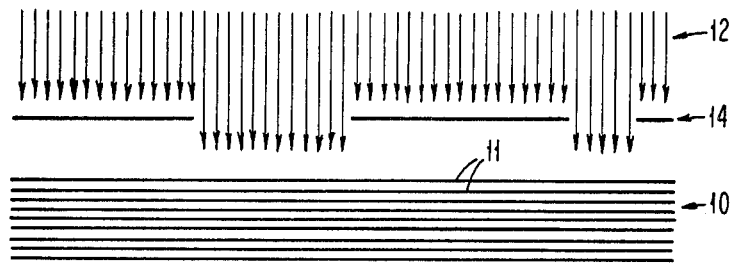
FIG. 1.1 LIGHT ABSORPTION
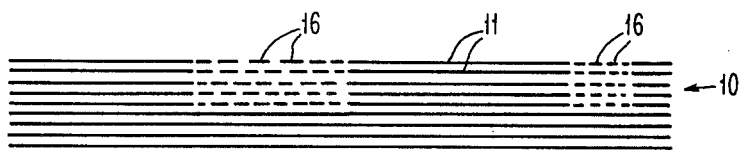
FIG. 1.2 BOND BREAKING
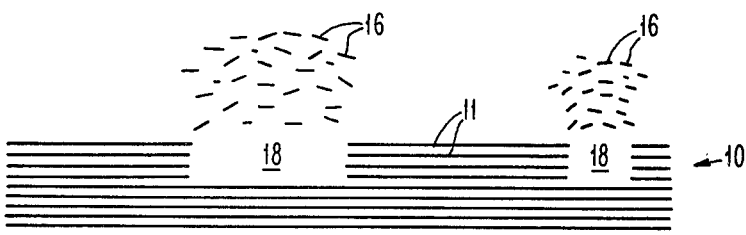
FIG. 1.3 ABLATION

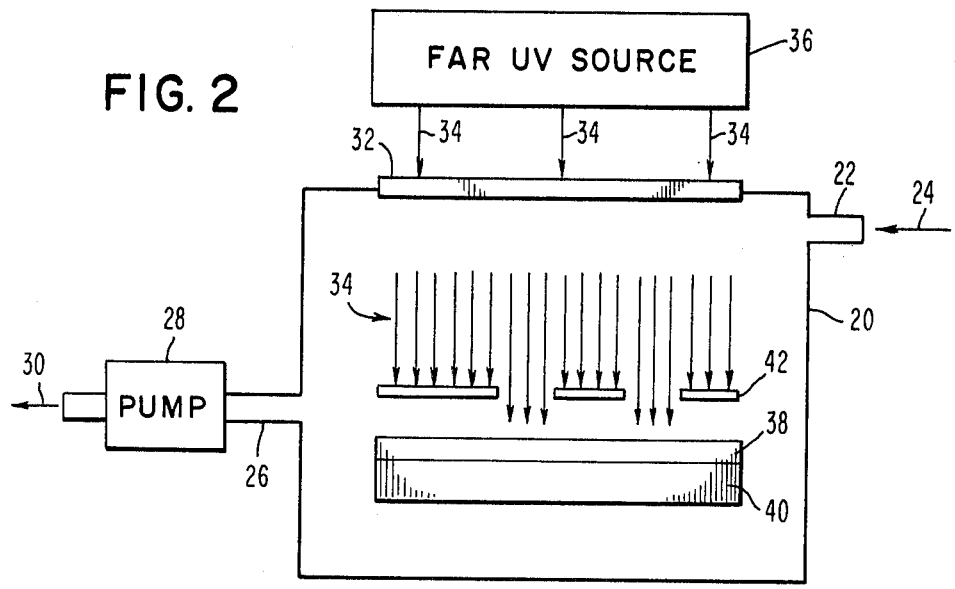
FIG. 2
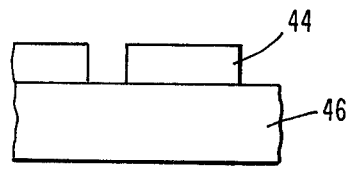
FIG. 4.1
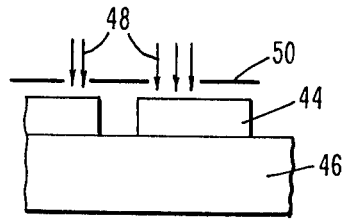
FIG. 4.2
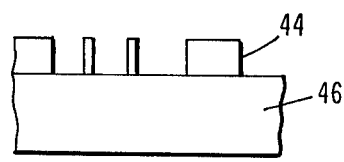
FIG. 4.3

FAR UV PATTERNING OF RESIST MATERIALS

DESCRIPTION

1. Technical Field

This invention relates to a technique for patterning resist materials of the type used in lithographic processes, and more particularly to a technique for patterning these resists with extremely high efficiencies and rates of removal.

2. Background Art

The use of resist layers comprised of organic materials is well known in the fabrication of microelectronic devices, and many different types of resists are available. These resists are designed to be sensitive to radiation of different wavelengths, including visible wavelengths, ultraviolet wavelengths, electron beams, and X-rays. In operation, the resists are exposed by incident radiation, and the exposed regions are either soluble (positive resist) or insoluble (negative resist) when developed later by a chemical solution. After development, a pattern is left in the resist layer, in accordance with the pattern of exposure.

The resolution obtainable in producing patterns depends inversely upon the wavelength used to expose the resist. For this reason, organic resists sensitive to short wavelength radiation, such as ultraviolet radiation, electron beams, and X-rays, have been developed.

In the prior art, there have been attempts to eliminate the development steps, and these have had some mixed degree of success. For example, reference is made to an article by Ueno et al, entitled "Direct Etching of Resists by UV Light", which appeared in the Japanese Journal of Applied Physics, Vol. 20, No. 10, October 1981, at pages L709-L712. In this article, the authors describe dry etching of photoresists by ultraviolet light having wavelengths 180–290 nm. The process by which dry etching occurs in an oxidative process which will not proceed in the absence of an oxygen environment. The authors therein used 180 nm ultraviolet light from a stationary deuterium discharge lamp having a power of approximately 8 mJ/cm$^2$. Photoetching was observed, but the etching rates were quite slow, and oxygen was needed in the etching environment. In the case of AZ-1350 resist (produced by the Shipley Corporation), no etching was observed even after irradiation for more than 100 minutes.

As noted, photoetching in accordance with this referenced article relies on an oxidative reaction. The incoming ultraviolet light photons are used to break bonds in the resist material, which is what any ultraviolet ray will do. After the bonds are broken, oxygen enters and is absorbed in the polymer chains. The presence of oxygen is required to allow the bond-breaking process to continue and to produce oxidized species that can be removed. This is a process which is temperature dependent and which will slow down considerably as the system is cooled. It is also a process which does not have a strict dependence on the wavelength of the light which is used. In fact, any ultraviolet wavelength can be used, since the only purpose of the ultraviolet light is to break bonds so that oxygen can enter the fragmented polymer chains. Bond-breaks deep into the polymer are not required because the oxygen will not be able to diffuse into the depth of the polymer to oxidize the fragmented chains. Thus, in the process of that reference, any wavelength ultraviolet light can be used as long as oxygen is present.

In that reference, the etch rates are very slow, and certain resists (such as A.Z. 1350) cannot be photoetched by that process.

In contrast to the techniques of the prior art using oxidative removal, the present invention is directed to a new and completely different mechanism which does not depend on the nature of the organic resist, on the presence of oxygen, or on temperature. In further contrast with the technique of oxidative removal, the technique of this invention is critically dependent upon the wavelength of the applied radiation and on its power density (or energy fluence). It is termed "ablative photodecomposition" (APD), and requires high powered pulsed sources.

In APD, a large number of photons of a particular wavelength are directed to the resist material in a short time. The efficiency for absorption of these photons is very high, and many polymer chain fragments are produced in a small volume in a very short amount of time. This causes a localized increase in volume which cannot be sustained, and the pressure is relieved by the process of ablation, wherein fragmented chains explode and escape from the resist, leaving an etched material. In this process, a rapid and large amount of bond-breaking must occur at the surface of the resist in order to allow the fragmented by-products to explode and escape from the surface of the resist. The process is such that the incident energy is transferred to kinetic energy of the ablated by-products. Ablative photodecomposition leads to extremely high etch rates, being at least 30 times as great as those obtainable in oxidative removal processes.

Accordingly, it is a primary object of the present invention to provide a new technique for etching resist materials by applied radiation, without requiring a development step.

It is another object of this invention to provide a technique for etching resist materials with high efficiency.

It is another object of this invention to provide a technique for etching resist materials wherein very high rates of removal are obtained, without the necessity of a development step.

It is another object of the present invention to provide a technique using irradiation for etching all types of resist.

It is yet another object of the present invention to provide a technique for etching all types of organic resist material without the need for a particular type of gaseous environment.

It is a further object of this invention to provide a technique for etching all types of resist materials, in which temperature is not critical.

It is a still further object of this invention to provide a technique for etching organic resist materials by a new mechanism having extremely high efficiency.

It is another object of the present invention to provide a technique for etching organic resist materials to produce fine line patterns therein wherein said technique can be readily applied to practical processes or device fabrications, and which does not require subsequent development steps.

It is another object of the present invention to provide a dry etch process for selectively removing portions of an organic resist layer which can be used to etch any type of organic resist material in any atmosphere or in vacuum, and at any temperature.

DISCLOSURE OF THE INVENTION

In the practice of this invention, organic resist materials of any type which are used in lithographic processes can be patterned by irradiation with ultraviolet radiation having wavelengths less than 220 nm and a power density at least as great as that which is necessary to cause ablative photodecomposition of the resist material. That is, the radiation source must provide a sufficient number of photons in a short amount of time so that the resist polymer chains will be broken into fragments which ablate and are blown off as volatile by-products. This effect can occur in all resist materials and in a vacuum or other atmospheres, and is characterized by very large etch rates and a critical dependence on wavelength and power density.

Pulsed radiation sources must be used, rather than continuous sources, in order to provide a sufficient amount of photons in the irradiated area of the resist in a very short amount of time. A particular example is pulsed laser radiation produced by an ArF excimer laser providing pulses approximately 10 nsec wide at 193 nm. The critical (threshold) energy fluence is approximately 10–15 mJ/cm$^2$. Irradiation can proceed in a vacuum, or in a gaseous environment, including air and oxygen. The presence of oxygen is not required for ablative photodecomposition, but may make the process more efficient. The temperature of the organic resist is not critical, room temperatures being suitable.

In the practice of this invention, the organic resists are those materials which are sensitive to incident radiation, where the resist is a material to be used in a lithographic process to produce devices and circuits.

The objects, features, and advantages of the present invention will be apparent from the following more particular description of the preferred embodiments.

BRIEF DESCRIPTION OF THE DRAWINGS

FIGS. 1.1–1.3 schematically illustrate the process of ablative photodecomposition.

FIG. 2 schematically illustrates an apparatus suitable for carrying out the present invention.

FIGS. 4.1–4.3 illustrate the use of ablative photodecomposition to pattern for a second time a negative resist layer which has been patterned by conventional techniques.

BEST MODE FOR CARRYING OUT THE INVENTION

Figure 3:
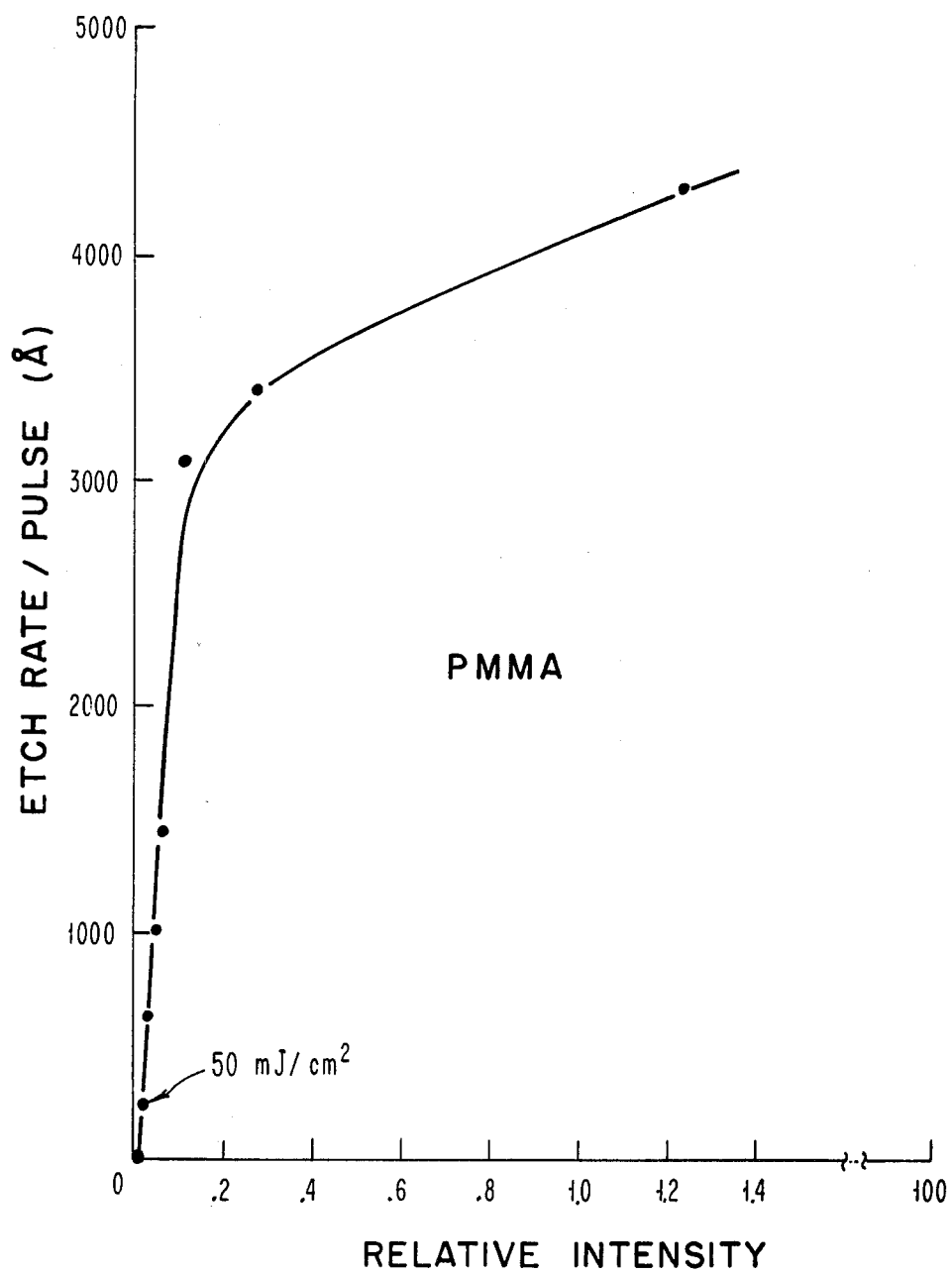
FIG. 3 is a plot of etch rate/pulse versus relative intensity of the input radiation for ablative photodecomposition of poly (methylmethacrylate-PMMA) resist, using 193 nm laser radiation from a pulsed ArF laser.

The present invention relates to the patterning of resist layers of the type used in lithographic processes by ablative photodecomposition. FIGS. 1.1–1.3 illustrate this mechanism.

In FIG. 1.1, a resist layer 10 is schematically illustrated by a group of horizontal lines 11, representing polymer chains in the resist layer. Far UV light of wavelengths less than 220 nm and sufficiently high power density to cause ablative photodecomposition, represented by the arrows 12, is directed toward resist layer 10. A mask 14 is used to define the areas of resist 10 which are to be irradiated by the ultraviolet radiation. This is the light absorption part of ablative photodecomposition, where the absorption of incoming photons is confined to a thin surface layer, typically less than 3000 Å. Generally, about 95% of the input photons are absorbed in the first 2700 angstroms of the resist layer 10.

FIG. 1.2 represents the second step in the ablative photodecomposition process. This is termed bond-breaking, in which the incoming photons break the long polymer chains 11 in resist layer 10. This is indicated by the small broken fragments 16 in those areas where the radiation strikes resist 10. The quantum yield for bond-breaking breaking at wavelengths less than 220 nm is very high, typically 750% for radiation at 193 nm.

The third step, ablation, is illustrated in FIG. 1.3. Ablation occurs when the fluence of the laser pulse exceeds a threshold value ($\sim$ 10 mJ/cm$^2$), and is caused by an increase in pressure when small fragments 16 replace the long chains 11 in the resist layer. The small fragments 16 are produced in a very short amount of time in a small volume, and require more volume than the long, unbroken chains. This sudden buildup in pressure causes ablation, in which the fragments 16 explosively burst out of the irradiated volume, leaving ablatively photodecomposed regions 18. The energy of the photons exceeds the dissociation energy of any of the bonds in the organic resist molecules, and the excess energy is carried away by the fragments. The area of removal of the resist material by APD is completely defined by the light, and the remaining resist is not heated. In this process, the presence of a gaseous atmosphere is not required, but oxidation in air will promote the reaction and increase its efficiency.

Ablative photodecomposition requires that a large number of fragments 16 be created in the irradiated volume of the resist layer 10 in a short amount of time. This requires pulsed radiation of the type produced by a laser, such as the ArF excimer laser which produces ultraviolet radiation at 193 nm. These lasers provide pulsed outputs of about 10–15 nsec width, and can provide 10–100 pulses per second. The energy fluence of these pulses is typically in excess of 10 mJ/cm$^2$.

While a representative example using the ArF laser is given, it should be understood that the amount of power density required in the input pulse, and the time in which the bond-breaking must occur, will depend to some degree on the nature of the resist layer. It has been found that photoresist layers of the type commercially available can be ablatively photodecomposed by pulsed 193 nm radiation from the ArF excimer laser.

As has been noted, a large amount of energy, greater than a threshold amount, must be applied before ablation will occur. Energies and power densities of this magnitude are usually available only from lasers. Interestingly, the time integrals of applied energy, from both a laser and a stationary lamp, are often the same in terms of total power; however, the input energy must be sufficiently great and must be applied in a very short amount of time in order to produce ablative photodecomposition. This is why lasers are effective for APD and presently available stationary lamps are not.

FIG. 2 shows an apparatus which is suitable for carrying out ablative photodecomposition. The apparatus is comprised of a vacuum chamber 20 having an input port 22 through which gases, including air, can be admitted, as indicated by arrow 24. Chamber 20 is provided with an output port 26 to which a pump 28 is attached for removing volatile by-products and gases from chamber 20 as indicated by arrow 30. A quartz window 32 allows ultraviolet radiation 34 to enter chamber 20. This radiation is provided by the far-UV source 36, which produces radiation of wavelengths less than 220 nm and of sufficient power density to produce ablative photodecomposition.

Located within chamber 20 are the resist layer 38 to be patterned, and the substrate 40 on which resist layer 38 is located. Substrate 40 can be comprised of a multitude of layers including metals, insulators, and semiconductors. Resist layer 38 is typically present to provide a mask for the patterning of underlying layers, or for selective deposition of another layer, etc., as is well known in lithographic processes. If desired, a mask 42 is used to define the areas of resist layer 38 to be irradiated.

As was noted, the source 36 is typically a laser source which will provide a sufficient number of photons of at least a threshold energy fluence in a very short amount of time, the amount of energy and the period of time being chosen to be sufficient to ablatively photodecompose the irradiated areas of layer 38. A suitable laser is the ArF excimer laser providing a pulsed output at 193 nm.

It has been mentioned that the laser source must provide a sufficient amount of energy in a short amount of time in order to cause ablative photodecomposition. For commercially available resists irradiated by ArF laser pulses 12 nsec wide, it has been found that an energy fluence of 7.5 mJ/cm$^2$/pulse is not sufficient to ablatively photodecompose the resist, while energy fluences of 15 mJ/cm$^2$/pulse are sufficient. A threshold appears to be between these two energy fluences and is probably about 10–12 mJ/cm$^2$/pulse.

FIG. 3 is a plot of the etch rate per pulse plotted against the relative intensity of the input laser pulse, when PMMA is ablatively photodecomposed. The highly nonlinear nature of ablative photodecomposition is readily apparent from FIG. 3. This contrasts greatly with the more linear etch rates which are obtained using oxidative removal as the etching mechanism. The etch rate/pulse increases greatly once a threshold of intensity is reached. Extremely high etch rates can be obtained having magnitudes which can never be obtained with oxidative removal processes.

FIGS. 4.1–4.3 illustrate a particular use for this invention, where a single layer of negative resist is used to provide different patterns.

In FIG. 4.1, a negative resist layer 44 is located on a substrate 46. Substrate 46 can be comprised of multilayers of films of all types, including insulators, metals, and semiconductors. In this film fabrication technique, it is desired to pattern a layer located under negative resist 44. Accordingly, in FIG. 4.1, negative resist 44 has been patterned in a conventional way, including exposure to long wavelength radiation of the wavelengths typically used in the art to produce cross-linking of the polymer chains where the radiation strikes resist layer 44. These irradiated regions become insoluble when a development solution is applied to the resist. Thus, this is a negative resist because the portions remaining after development are those portions which were not exposed to the incident light. Using this resist pattern, a subsequent fabrication step, such as an etching, doping, etc. of substrate 46, can be undertaken.

In FIG. 4.2, the same resist pattern remains on the substrate 46. At this time, short wavelengths of ultraviolet radiation 48 having wavelengths less than 220 nm are used to ablatively photodecompose portions of the resist layer 44. Those portions to be irradiated are determined by the mask 50. The ablative photodecomposition will cause removal of the resist layer where it is irradiated to yield the pattern shown in FIG. 4.3. In the ablative photodecomposition step, portions of the resist layer which are irradiated are removed and the negative resist becomes a "positive" resist. In this manner, a new pattern is provided for subsequent processing of substrate 46.

The practice of this invention is primarily directed to ablative photodecomposition of resist materials, either positive or negative, and particularly the use of this technique for device and circuit fabrication. Any type of resist material can be ablatively photodecomposed, but the invention is limited to resist materials which will be used in lithography. Thus, in the process described by FIGS. 4.1–4.3, the next step would be the removal of resist layer 44 and the continuance of the device or circuit fabrication process. These additional steps include the deposition of subsequent layers or the etching of existing layers, where resists are required to be patterned for either additive or subtractive steps in the process.

While all types of resist materials can be patterned by APD, the invention is particularly suited to the patterning of photoresists. Included among the many resists which can be patterned are Kodak photoresists (KPR), thin photoresists (KTFR), and orthoresists (KOR), all of which are produced by the Kodak Company, Rochester, N.Y. the AZ series of resists produced by the Shipley Company, The RISTON resists (a trademark of E. I. DuPont de Nemours Company), and resists produced by the Hunt Chemical Company.

Thus, in the practice of this invention an improved device and circuit fabrication process is described in which resist layers are patterned to define a subsequent fabrication step, including modification of an underlying layer as by doping, addition of another layer, or subtraction of an underlying layer. The nature of the layer to be affected through the ablatively photodecomposed resist layer can be any material, including insulators, metals, and semiconductors.

While the invention has been described with respect to particular embodiments thereof, it will be understood by those of skill in the art that variations may be made therein without departing from the spirit and scope of the invention.

Having thus described our invention, what we claim as new and desire to secure by Letters Patent is:

1. In a thin film fabrication process for producing a device or circuit, the steps as follows:
   providing a substrate including at least one layer therein,
   depositing a resist layer on said substrate,
   removing selected areas of said resist layer by irradiation of said selected areas with ultraviolet light of wavelengths less than 220 nm and having a sufficient power density to produce ablative photodecomposition of said irradiated areas to expose portions of said substrate, and
   causing a change to said exposed portions of said substrate through said patterned resist layer.

2. The process of claim 1, in which said ultraviolet radiation is pulse radiation having a fluence greater than 10 mJ/cm$^2$/pulse.

3. The method of claim 2, where said ultraviolet radiation is produced by an ArF laser and the wavelength of said radiation is 193 nm.

4. The process of claim 1, where said resist is either a negative or a positive resist.

5. The process of claim 1, where the final step thereof is the addition of a layer to said exposed portions of said substrate through said patterned resist layer.

6. The process of claim 1, where the final step thereof is the etching of said exposed portions of said substrate through said patterned resist layer.

7. The process of claim 1, where the final step thereof includes the treatment of said exposed portions of said substrate through said patterned resist layer to modify the characteristics of said exposed portions.

8. A method for patterning resist layers of the type used in lithography processes, comprising the steps of:
depositing a layer of said resist on a substrate, and irradiating selected areas of said resist layer with ultraviolet radiation having wavelengths less than 220 nm and an energy fluence in excess of that required to break polymer chains in said resist layer to produce enough broken fragments of said chains in a given time that said broken fragments will ablate and escape from said resist, leaving etched areas corresponding to the pattern of ultraviolet radiation incident on said resist layer.

9. The method of claim 8, where said resist layer is selected from the group consisting of positive and negative resist materials.

10. The method of claim 8, where said wavelength is 193 nm.

11. The method of claim 8, where the fluence of said radiation is in excess of 10 mJ/cm$^2$.

12. The method of claim 8, where said radiation is produced by a laser, and is pulsed radiation.

13. The method of claim 8, where said radiation is pulse radiation, and wherein the incidence of pulses of radiation on said resist layer is repeated for a sufficient amount of time to remove the entire thickness of said resist layer.

14. The method of claim 8, where said resist layer is irradiated in small regions less than 1 micron wide.

15. A method for patterning layers of resist material of the types used in lithographic processes, wherein selected areas of said resist layer are irradiated with ultraviolet radiation having wavelengths less than 220 nm and energy fluences in excess of about 10 mJ/cm$^2$/pulse.

16. The method of claim 15, where said radiation is produced by an ArF laser having an output wavelength of 193 nm.

17. The method of claim 15, where said ultraviolet radiation is pulsed radiation, the incidence of said pulses of radiation on said resist layer continuing until said resist layer is removed through its entire thickness.

* * * * *